United States Patent
Lai

(10) Patent No.: US 8,664,758 B2
(45) Date of Patent: Mar. 4, 2014

(54) SEMICONDUCTOR PACKAGE HAVING RELIABLE ELECTRICAL CONNECTION AND ASSEMBLING METHOD

(75) Inventor: Chih-Chen Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/569,194

(22) Filed: Aug. 8, 2012

(65) Prior Publication Data

US 2013/0320557 A1 Dec. 5, 2013

(30) Foreign Application Priority Data

May 31, 2012 (TW) .................................. 101119624

(51) Int. Cl.
*H01L 23/34* (2006.01)
*H01L 21/00* (2006.01)

(52) U.S. Cl.
USPC ............ 257/712; 257/E23.101; 257/E23.102; 438/122

(58) Field of Classification Search
USPC .................. 257/712, 744, E23.101, E23.102; 438/122
See application file for complete search history.

(56) References Cited

U.S. PATENT DOCUMENTS 7,482,686 B2 * 1/2009 Zhao et al. ..................... 257/710
2004/0241912 A1 * 12/2004 Chiu ............................. 438/122

* cited by examiner

*Primary Examiner* — Daniel Whalen
(74) *Attorney, Agent, or Firm* — Altis Law Group, Inc.

(57) ABSTRACT

A semiconductor package includes a printed circuit board, a chip, a protection frame, and a covering layer. The chip is mounted on the printed circuit board and is electrically connected to the printed circuit board through a number of first bonding wires. The protection frame includes a sidewall surrounding the chip and the bonding wires and defines a number of through holes passing through an inner surface and an outer surface of the sidewall. The protection frame is filled with adhesive. The adhesive adheres to the inner surface and covers the chip and the boding wires. The covering layer is coated on the outer surface and covers the through holes.

15 Claims, 3 Drawing Sheets

SEMICONDUCTOR PACKAGE HAVING RELIABLE ELECTRICAL CONNECTION AND ASSEMBLING METHOD

BACKGROUND

1. Technical Field

The present disclosure relates to a semiconductor package and an assembling method for the semiconductor package.

2. Description of Related Art

Semiconductor packages usually include a printed circuit board (PCB), a chip (i.e., a semiconductor die) mounted on the PCB, and a protection frame. The chip is electrically connected to the PCB via bonding wires. The protection frame is positioned on the PCB and includes a sidewall surrounding the chip and the bonding wires for protecting the chip. Adhesive is filled into the frame to encapsulate the bonding wires and the chip. The adhesive is adhered to an inner surface of the sidewall such that the frame is also fixed on the PCB. To prevent moisture entering the frame from the sidewall to influence the chip, the sidewall is usually continuous. However, the chip generates a great amount of heat when working. As a consequence, the adhesive is heated and expands. The sidewall and the bonding wires may thus be damaged by stress force generated by the adhesive. Therefore, electrical connection reliability between the chip and the PCB decreases.

What is needed therefore is a semiconductor package and an assembling method for the semiconductor package addressing the limitations described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
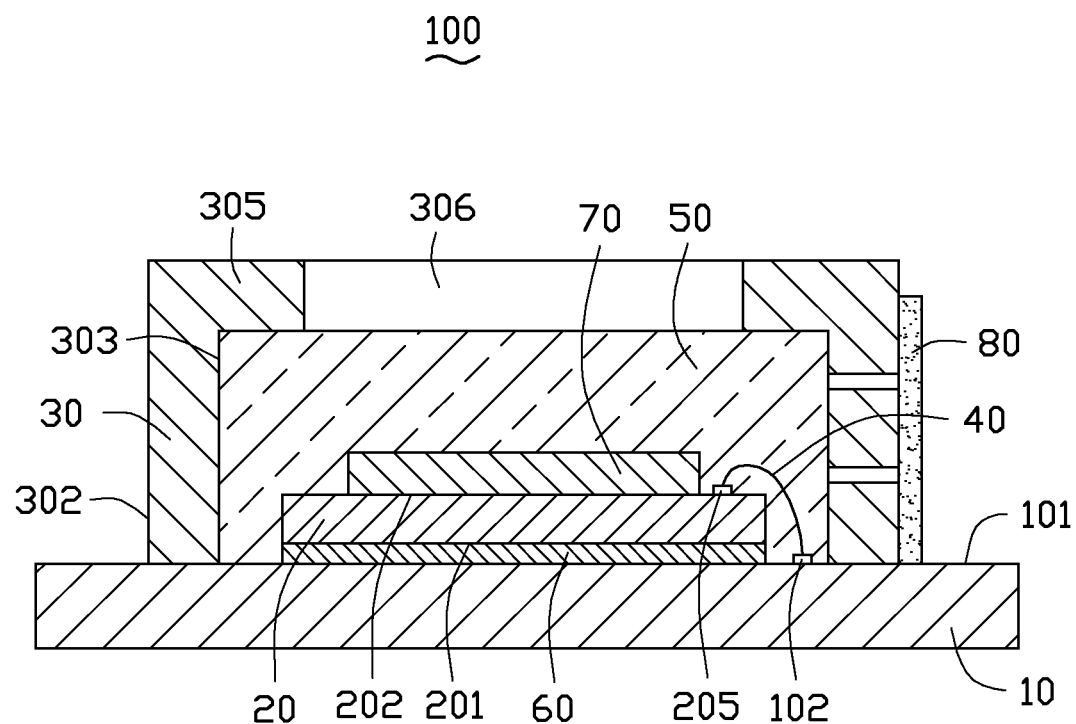
FIG. 1 is a cross-sectional view of a semiconductor package, according to an exemplary embodiment of the present disclosure.
Figure 2:
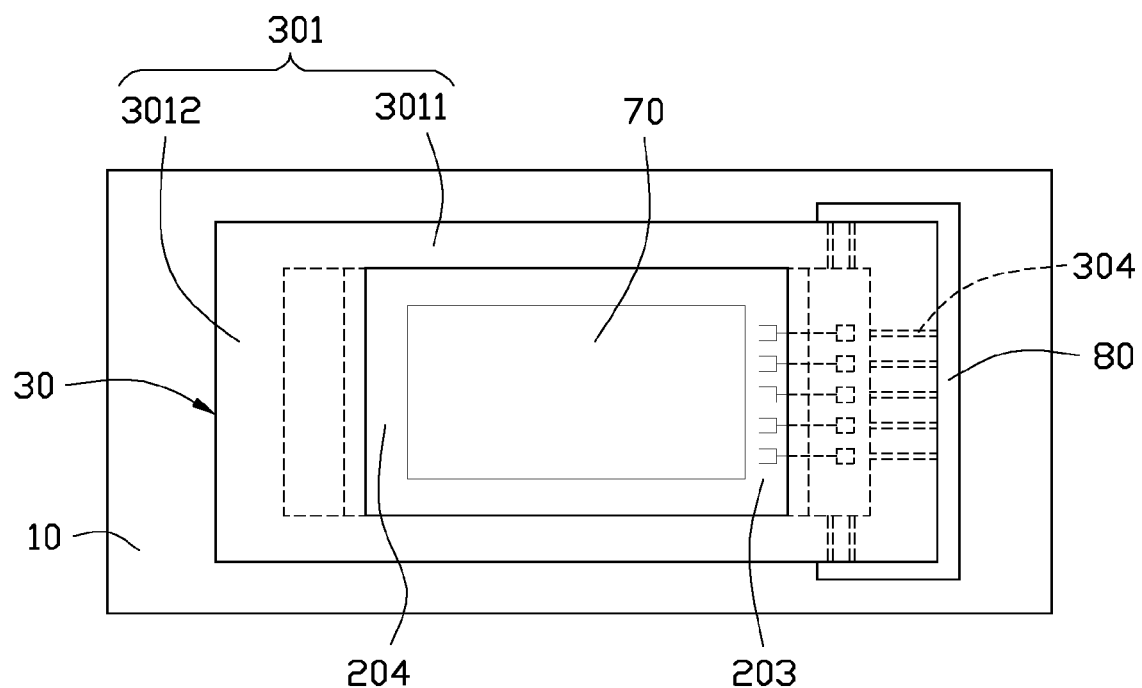
FIG. 2 is a top view of the semiconductor package of FIG. 1.

Referring to FIGS. 1 and 2, a semiconductor package 100, according to an exemplary embodiment, is shown. The semiconductor package 100 includes a PCB 10, a chip 20, and a protection frame 30.

The PCB 10 includes a supporting surface 101 and a number of first bonding pads 102 formed on the supporting surface 101. The first bonding pads 102 connect to circuits (not shown) formed in the PCB 10.

The chip 20 is mounted on the supporting surface 101 and electrically connected to the first bonding pads 102 through a number of bonding wires 40. The bonding wires 40 can be gold wires or aluminum wires. In the embodiment, the chip 20 is a digital micro-mirror device (DMD). The chip 20 is substantially rectangular-shaped and includes a bottom surface 201, a top surface 202 opposite to the bottom surface 201, a first end 203 adjacent to the first bonding pads 102, and a second end 204 away from the first end 203.

The bottom surface 201 is adhered to the supporting surface 101 by an adhesive layer 60. The semiconductor package 100 further includes a glass plate 70 attached to the top surface 202. In the embodiment, the glass plate 70 is transparent and used for protecting the chip 20. An area of the glass plate 70 is smaller than that of the top surface 202. The first end 203 is adjacent to the first bonding pads 102. The chip 20 includes a number of second bonding pads 205 formed on the top surface 202 at the first end 203. Each second bonding pad 205 is electrically connected to a corresponding first bonding pad 102 through a bonding wire 40, such that the chip 20 is electrically connected to the PCB 10.

The protection frame 30 is made of metal, such as copper or aluminum. The protection frame 30 is substantially rectangular and includes a sidewall 301. The sidewall 301 includes a pair of long walls 3011, a pair of short walls 3012 perpendicularly connecting the long walls 3011, an outer surface 302, and an inner surface 303 opposite to the outer surface 302. The long walls 3011 and the short walls 3012 cooperatively surround the chip 20, the first bonding pads 102, and the bonding wires 40. The short walls 3012 extend to each other and form a pair of skirt portions 305 at their distal ends. The long walls 3011 and the skirt portions cooperatively form a rectangular aperture 306 for passing through light signals. One of the short walls 3012 is adjacent to the first boding pads 102 and the other short wall is away from the first bonding pads 102. The short wall 3012 adjacent to the first boding pads 102 defines a number of through holes 304 passing through the outer surface 302 and the inner surface 303. The long walls 3011 also define a number of through holes 304 adjacent to the first bonding pads 102.

Adhesive 50 is filled in the protection frame 30 to encapsulate the glass plate 70, the chip 20 and the bonding wires 40. In the embodiment, the adhesive 50 is transparent. The adhesive 50 is adhered to the inner surface 303 in such a way that the protection frame 30 is fixed on the PCB 10.

To prevent moisture entering the protection frame 30 from the sidewall 301 to influence the chip 20, the semiconductor package 100 further includes a covering layer 80 coated on the outer surface 302. The covering layer 80 is positioned outside the through holes 304 and covers the through holes 304. In the embodiment, the covering layer 80 is ultraviolet-curable adhesive.

When the chip 20 is working, it generates a great amount of heat. Expansion occurs to the adhesive 50 when the adhesive 50 is heated by the heat. However, a portion of the adhesive 50 is pressed into the through holes 304, such stress force of the heated adhesive 50 is released. It can avoid that the bonding wires 40 being pressed and damaged by the heated adhesive 50.

In the embodiment, the adhesive 50 is ultraviolet-curable adhesive which needs to be heated and cured under the ultraviolet light. Expansion occurs to the ultraviolet-curing adhesive 50 when the ultraviolet adhesive is heated. However, a portion of the ultraviolet curable adhesive is pressed into the through holes 304, such that stress force of the heated ultraviolet curable adhesive is released. It also can avoid that the bonding wire 40 being pressed and damaged by the heated ultraviolet curable adhesive.

In alternative embodiments, the through holes 304 can be only defined on the short wall 3012 adjacent to the first bonding pads 102, or one or both of the long walls 3011 adjacent to the first bonding pads 102, or one of the long walls 3011 and the short wall 3012 adjacent to the first bonding pads 102.

In alternative embodiments, the covering layer 80 can be partially filled into the through holes 304, while a thickness of the covering layer 70 filled into the through holes 304 is less than a depth of each through hole 304.

In alternative embodiments, the glass plate 70 can be omitted.

In alternative embodiments, the chip 20 is an image sensor and the glass plate 70 is an infrared cut filter.

Figure 3:
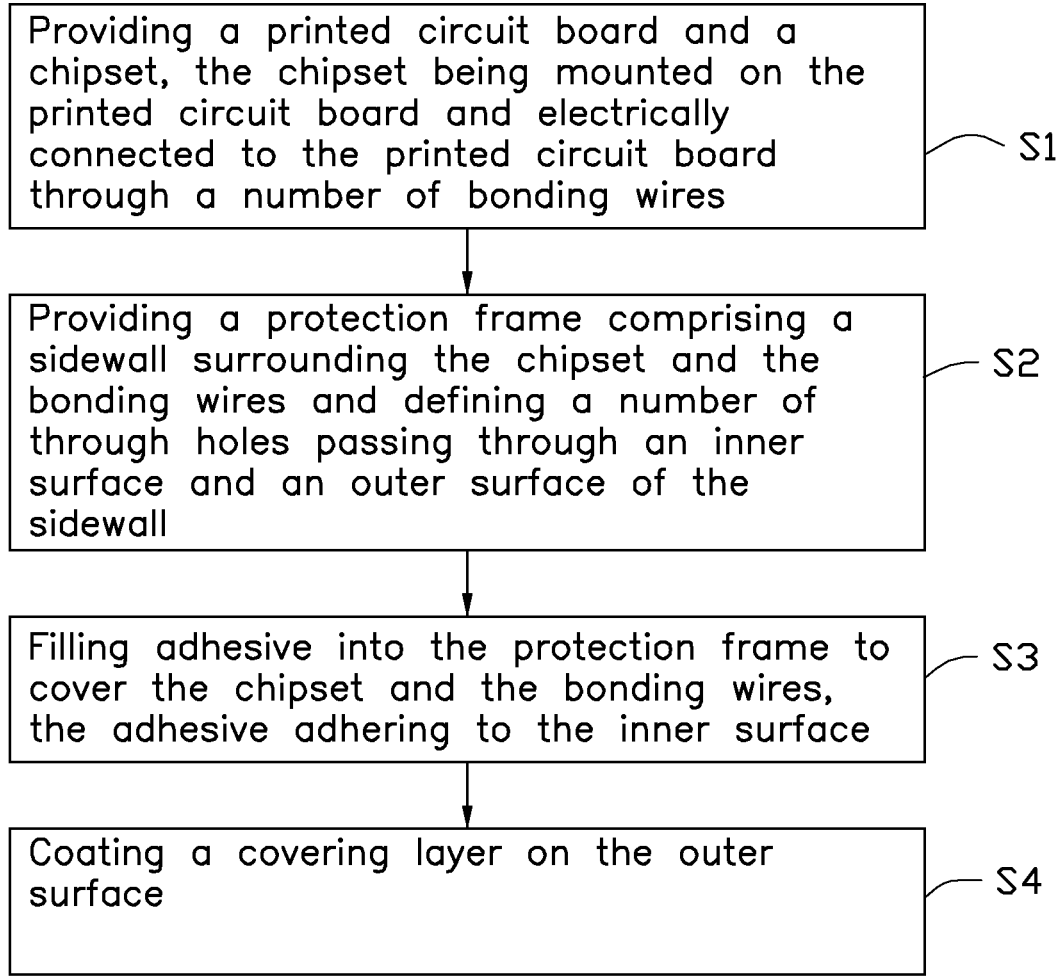
FIG. 3 is a flowchart of an assembling method for a semiconductor package according to an exemplary embodiment of the present disclosure.

Referring to FIG. 3, an embodiment of an assembling method for a semiconductor package is shown. The assembling method includes the following steps.

In step S1, providing a PCB 10 and a chip 20, the chip 20 being mounted on the PCB 10 and electrically connected to the PCB 10 through a number of bonding wires 40.

In step S2, providing a protection frame 30 including a sidewall 301 surrounding the chip 20 and the bonding wires 40. Defining a number of through holes 304 passing through an inner surface 303 and an outer surface 302 of the sidewall 301.

In step S3, filling adhesive 50 into the protection frame 30. The adhesive 50 covers the chip 20 and the bonding wires 40 and adheres to the inner surface 303.

In step S4, coating a covering layer 80 on the outer surface 303. The covering layer 80 is positioned outside the through holes 304 and covers the through holes 304.

In alternative embodiments, the assembling method further includes a step of positioning a glass plate 70 on the chip 20 between the step S2 and the step S3.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A semiconductor package, comprising:
   a printed circuit board;
   a chip mounted on the printed circuit board and electrically connected to the printed circuit board through a number of bonding wires;
   a protection frame comprising a sidewall surrounding the chip and the bonding wires, the protection frame defining a number of through holes passing through an inner surface and an outer surface of the sidewall, the protection frame being filled with an adhesive, the adhesive covering the chip and the boding wires and adhering to the inner surface; and
   a covering layer coated on the outer surface, the covering layer covering the through holes.

2. The semiconductor package of claim 1, wherein the printed circuit board comprises a supporting surface and a number of first bonding pads on the supporting surface; the chip is substantially rectangular-shaped and comprises a bottom surface, a top surface opposite to the bottom surface, a first end adjacent to the first bonding pads, and a number of second bonding pads; the bottom surface is positioned on the supporting surface, the second bonding pads are positioned on the top surface at the first end and electrically connected to the first bonding pads through the bonding wires.

3. The semiconductor package of claim 2, wherein the semiconductor package further comprises a glass plate, the glass plate is attached to the top surface, an area of the glass plate is smaller than an area of the top surface, the adhesive also covers the glass plate.

4. The semiconductor package of claim 3, wherein the glass plate is transparent.

5. The semiconductor package of claim 2, wherein the sidewall comprises a pair of long walls and a pair of short walls perpendicularly connecting the long walls; one of the short walls is adjacent to the first boding pads and the other short wall is away from the first bonding pads; the through holes are defined on the short wall adjacent to the first boding pads.

6. The semiconductor package of claim 5, wherein some of the through holes are defined in the long walls and are adjacent to the first bonding pads.

7. The semiconductor package of claim 5, wherein the short walls extend to each other and form a pair of skirt portions at their distal ends, the long walls and the skirt portions cooperatively defines a rectangular aperture.

8. The semiconductor package of claim 1, wherein the chip is a digital micro-mirror device.

9. The semiconductor package of claim 1, wherein the adhesive is ultraviolet-curable adhesive.

10. The semiconductor package of claim 1, wherein the adhesive is transparent.

11. An assembling method for a semiconductor package, comprising:
    providing a printed circuit board and a chip, the chip being mounted on the printed circuit board and electrically connected to the printed circuit board through a number of bonding wires;
    providing a protection frame comprising a sidewall, the sidewall surrounding the chip and the bonding wires, the protection frame defining a number of through holes passing through an inner surface and an outer surface of the sidewall;
    filling an adhesive into the protection frame to cover the chip and the bonding wires, the adhesive adhering to the inner surface; and
    coating a covering layer on the outer surface, the covering layer covering the through holes.

12. The assembling method of claim 11, further comprising a step of positioning a glass plate on the chip.

13. The assembling method of claim 11, wherein the printed circuit board comprises a supporting surface and a number of first bonding pads on the supporting surface; the chip is substantially rectangular-shaped and comprises a bottom surface, a top surface opposite to the bottom surface, a first end adjacent to the first bonding pads, and a number of second bonding pads; the bottom surface is positioned on the supporting surface, the second bonding pads are positioned on the top surface at the first end and electrically connected to the first bonding pads through the bonding wires.

14. The assembling method of claim 13, wherein the sidewall comprises a pair of long walls and a pair of short walls perpendicularly connecting the long walls; one of the short walls is adjacent to the first boding pads and the other short wall is away from the first bonding pads; the through holes are defined on the short wall adjacent to the first boding pads.

15. The assembling method of claim 14, wherein the short walls extend to each other and form a pair of skirt portions at their distal ends, and the long walls and the skirt portions cooperatively define a rectangular aperture.

* * * * *